US 011314222B2

(12) United States Patent
Tanouchi

(10) Patent No.: US 11,314,222 B2
(45) Date of Patent: Apr. 26, 2022

(54) SERVO AMPLIFIER SELECTION DEVICE, SERVO AMPLIFIER SELECTION METHOD AND NON-TRANSITORY COMPUTER READABLE MEDIUM RECORDING A SERVO AMPLIFIER SELECTION PROGRAM

(71) Applicant: FANUC CORPORATION, Yamanashi (JP)

(72) Inventor: Hironao Tanouchi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 125 days.

(21) Appl. No.: 16/426,097

(22) Filed: May 30, 2019

(65) Prior Publication Data

US 2019/0369597 A1 Dec. 5, 2019

(30) Foreign Application Priority Data

Jun. 4, 2018 (JP) .............................. JP2018-106968

(51) Int. Cl.
*G05B 9/02* (2006.01)
*G05B 19/4062* (2006.01)
(Continued)

(52) U.S. Cl.
CPC .......... *G05B 19/4062* (2013.01); *G06F 1/30* (2013.01); *H03F 3/04* (2013.01); *G05B 19/406* (2013.01); *G05B 2219/24139* (2013.01)

(58) Field of Classification Search
CPC .......... G05B 19/4062; G05B 19/4067; G05B 2219/24139; G05B 19/406; G06F 1/30; G06F 30/20; H03F 3/04
(Continued)

(56) References Cited

U.S. PATENT DOCUMENTS

| 2002/0010520 A1* | 1/2002 | Matsubara ........... G05B 19/414 700/95 |
| 2011/0234141 A1* | 9/2011 | Kataoka ............... G05B 19/406 318/563 |
| 2015/0073582 A1* | 3/2015 | Fukumoto .......... G05B 19/4155 700/170 |

FOREIGN PATENT DOCUMENTS

| JP | 2009-200070 | 9/2009 |
| JP | 2010-193687 | 9/2010 |

(Continued)

OTHER PUBLICATIONS

Notification of Reasons for Refusal dated Jun. 23, 2020 in corresponding Japanese Patent Application No. 2018-106968.

*Primary Examiner* — Bickey Dhakal
*Assistant Examiner* — Zemenay T Truneh
(74) *Attorney, Agent, or Firm* — Wenderoth, Lind & Ponack, L.L.P.

(57) ABSTRACT

An object is to realize a technology in which a more appropriate power failure operation can be performed when the configuration of a servo system is selected. A selection device 20 includes: a servo system selection unit 21b which selects a servo amplifier corresponding to the specification of a motor and a drive condition of the motor in a servo system; a UI display control unit 21a which receives the setting of a condition on a power failure operation in the servo amplifier selected by the servo amplifier selection unit; and a power failure operation determination unit 21d which determines, based on the condition on the power failure operation received in the power failure operation condition setting unit, a method for the power failure operation in the selected servo amplifier, and the UI display control unit 21a outputs the method for the power failure operation which is determined by the power failure operation determination unit.

13 Claims, 13 Drawing Sheets

(51) Int. Cl.
*G06F 1/30* (2006.01)
*H03F 3/04* (2006.01)
*G05B 19/406* (2006.01)

(58) Field of Classification Search
USPC .......................................... 361/23; 318/563
See application file for complete search history.

(56) References Cited

FOREIGN PATENT DOCUMENTS

| | | |
|---|---|---|
| JP | 2017-93209 | 5/2017 |
| WO | 2004/007333 | 1/2004 |
| WO | 2013/171844 | 11/2013 |

\* cited by examiner

FIG. 9

☐ METHOD FOR OPERATION AT TIME OF POWER FAILURE
● CONTROL POWER SUPPLY HOLDING UNIT···ONE IS NEEDED
● REGENERATIVE DISCHARGE UNIT···NOT NEEDED
● DC LINK VOLTAGE HOLDING UNIT···NOT NEEDED
  OPERATION BY SOFTWARE: SET SUCH THAT CNC PARAMETER NO. XXXX = 1

DISPLAYED WHEN OPERATION BY SOFTWARE IS EFFECTIVE

FIG. 12

☐ ADD OPTIONAL UNIT
☐ NOT ADD OPTIONAL UNIT

CONFIRM POWER FAILURE OPERATION AUXILIARY INFORMATIO| CONFIRM |

PLACE WHERE SERVO SYSTEM PLANNED TO BE DELIVERED:     | TOKYO JAPAN |

FIG. 13

IN PLANNED DELIVERY PLACE OF TOKYO JAPAN,
XX STOPS OF SYSTEMS ARE CAUSED BY POWER FAILURE,
AMONG THEM, YY STOPS ARE SAFELY RESTORED BY OPTIONAL
UNIT

FIG. 14

☐ ADD OPTIONAL UNIT
☐ NOT ADD OPTIONAL UNIT

CONFIRM POWER FAILURE OPERATION AUXILIARY INFORMATION [CONFIRM]

PLACE WHERE SERVO SYSTEM PLANNED TO BE DELIVERED:   [TOKYO JAPAN]
TYPE OF SERVO SYSTEM:   [GEAR MACHINE]

FIG. 15

WITH CONSIDERATION GIVEN TO PLANNED DELIVERY PLACE AND TYPE OF SYSTEM, RISK IS EXTREMELY HIGH WHEN NO OPERATION IS PERFORMED AT TIME OF POWER FAILURE
SINCE BROKEN PIECES OF WORKPIECE ARE OFTEN SCATTERED AT TIME OF POWER FAILURE, IT IS RECOMMENDED TO SEPARATE MOVABLE COUPLING UNIT

SERVO AMPLIFIER SELECTION DEVICE, SERVO AMPLIFIER SELECTION METHOD AND NON-TRANSITORY COMPUTER READABLE MEDIUM RECORDING A SERVO AMPLIFIER SELECTION PROGRAM

This application is based on and claims the benefit of priority from Japanese Patent Application No. 2018-106968, filed on 4 Jun. 2018, the content of which is incorporated herein by reference.

BACKGROUND OF THE INVENTION

Field of the Invention

The present invention relates to a servo amplifier selection device, a servo amplifier selection method and a non-transitory computer readable medium recording a servo amplifier selection program.

Related Art

Conventionally, a servo amplifier selection device is known which automatically selects the configuration of a servo system including a servo amplifier and a servo motor and which assists a selection made by a user. For example, patent document 1 discloses a technology in which when a user inputs machine conditions of a desired motor system, the selection device of the motor system compares the input machine conditions and previously stored specification data of the motor system so as to select a motor that meets the machine conditions.

Patent Document 1: Japanese Unexamined Patent Application, Publication No. 2017-093209

SUMMARY OF THE INVENTION

However, when the configuration of a servo system is selected, it is required to consider not only the meeting of necessary machine conditions and the like but also the appropriateness of a power failure operation such as the safety of an operation at the time of power failure and ease of restoration. By contrast, in the conventional technology, there is room for improvement in the performance of a more appropriate power failure operation when the configuration of a servo system is selected.

An object of the present invention is to realize a technology in which a more appropriate power failure operation can be performed when the configuration of a servo system is selected.

(1) A servo amplifier selection device (for example, a selection device 20 which will be described later) according to one aspect of the present invention includes: a servo amplifier selection unit (for example, a servo system selection unit 21b which will be described later) which selects a servo amplifier corresponding to the specification of a motor and a drive condition of the motor in a servo system; a power failure operation condition setting unit (for example, a UI display control unit 21a which will be described later) which receives the setting of a condition on a power failure operation in the servo amplifier selected by the servo amplifier selection unit; a power failure operation determination unit (for example, a power failure operation determination unit 21d which will be described later) which determines, based on the condition on the power failure operation received in the power failure operation condition setting unit, a method for the power failure operation in the selected servo amplifier; and a power failure operation output unit (for example, a UI display control unit 21a which will be described later) which outputs the method for the power failure operation that is determined by the power failure operation determination unit.

(2) In the servo amplifier selection device of (1), the power failure operation determination unit may determine the method for the power failure operation in the selected servo system to be either a method for the power failure operation which can be realized by control of software or a method for the power failure operation which can be realized by installation of hardware.

(3) In the servo amplifier selection device of (1) or (2), the power failure operation condition setting unit may receive a selection of a power failure action selection part which has a function of selecting an operation at the time of power failure in the selected servo system, and calculate, based on the result of the selection received, a condition necessary for performing the power failure operation, and the power failure operation determination unit may determine, based on the condition necessary for the power failure operation which is calculated by the power failure operation condition setting unit, the method for the power failure operation in the selected servo amplifier.

(4) The servo amplifier selection device of any one of (1) to (3) may include: an information acquisition unit (for example, an information request unit 21e which will be described later) that acquires, from a power failure information database in which the place of use of the servo system and the situation of occurrence of the power failure are associated and stored, the situation of occurrence of the power failure corresponding to the place of use of the selected servo system, and the power failure operation output unit may output the situation of occurrence of the power failure which is acquired by the information acquisition unit.

(5) In the servo amplifier selection device of (4), in the power failure information database, the situation of occurrence of the power failure and restoration information on the servo system which is restored from the power failure by performing the power failure operation may be associated and stored, the information acquisition unit may acquire the situation of occurrence of the power failure corresponding to the place of use of the selected servo system and the restoration information corresponding to the situation of occurrence of the power failure and the power failure operation output unit may output the situation of occurrence of the power failure and the restoration information which are acquired by the information acquisition unit.

(6) In the servo amplifier selection device of (4) or (5), the power failure information database may be sequentially updated by information on operations from a plurality of the servo systems which are connected through a network.

(7) In the servo amplifier selection device of any one of (4) to (6), the power failure operation condition setting unit may receive an input of a classification of the servo system, and the power failure operation output unit may output, based on the classification of the servo system which is input and the situation of occurrence of the power failure which is acquired by the information acquisition unit, information on a risk at the time of power failure and information on the necessity of the power failure operation corresponding to the risk.

(8) In the servo amplifier selection device of (7), the information acquisition unit may acquire, from a hazard information database in which hazard information indicating a failure that can occur at the time of power failure in the servo system is associated with the classification of the servo system and is stored, the hazard information corresponding to the selected servo system, and the power failure operation output unit may output, based on the hazard information acquired by the information acquisition unit, the information on the risk at the time of power failure.

(9) In the servo amplifier selection device of (8), the hazard information database may be sequentially updated based on the information on the operations from a plurality of the servo systems which are connected through the network.

(10) In the servo amplifier selection device of (8) or (9), in the hazard information database, the power failure operation for the hazard information identified from the restoration information on the servo system which is restored from the power failure by performing the power failure operation may be stored, and the information acquisition unit may acquire the power failure operation for the hazard information together with the hazard information.

(11) A servo amplifier selection method according to one aspect of the present invention includes: a servo amplifier selection step of selecting a servo amplifier corresponding to the specification of a motor and a drive condition of the motor in a servo system; a power failure operation condition setting step of receiving the setting of a condition on a power failure operation in the servo amplifier selected in the servo amplifier selection step; a power failure operation determination step of determining, based on the condition on the power failure operation received in the power failure operation condition setting step, a method for the power failure operation in the selected servo amplifier; and a power failure operation output step of outputting the method for the power failure operation that is determined in the power failure operation determination step.

(12) A program according to one aspect of the present invention makes a computer realize: a servo amplifier selection function of selecting a servo amplifier corresponding to the specification of a motor and a drive condition of the motor in a servo system; a power failure operation condition setting function of receiving the setting of a condition on a power failure operation in the servo amplifier selected by the servo amplifier selection function; a power failure operation determination function of determining, based on the condition on the power failure operation received by the power failure operation condition setting function, a method for the power failure operation in the selected servo amplifier; and a power failure operation output function of outputting the method for the power failure operation that is determined by the power failure operation determination function.

According to the present invention, it is possible to realize a technology in which a more appropriate power failure operation can be performed when the configuration of a servo system is selected.

BRIEF DESCRIPTION OF THE DRAWINGS

FIG. 9 is a schematic view showing an example of necessary configuration conditions at the time of power failure which are displayed for the input example of FIG. 8;

FIG. 12 is a schematic view showing an example of a UI screen for inputting the setting conditions of a power failure operation for a selected servo system in a second embodiment;

FIG. 13 is a schematic view showing an example of the UI screen on which power failure operation auxiliary information is displayed;

FIG. 14 is a schematic view showing an example of a UI screen for inputting the setting conditions of a power failure operation for a selected servo system in a third embodiment; and FIG. 15 is a schematic view showing an example of the UI screen on which power failure operation auxiliary information is displayed.

DETAILED DESCRIPTION OF THE INVENTION

Embodiments of the present invention will be described below with reference to drawings.

First Embodiment

[Configuration]

Figure 1:
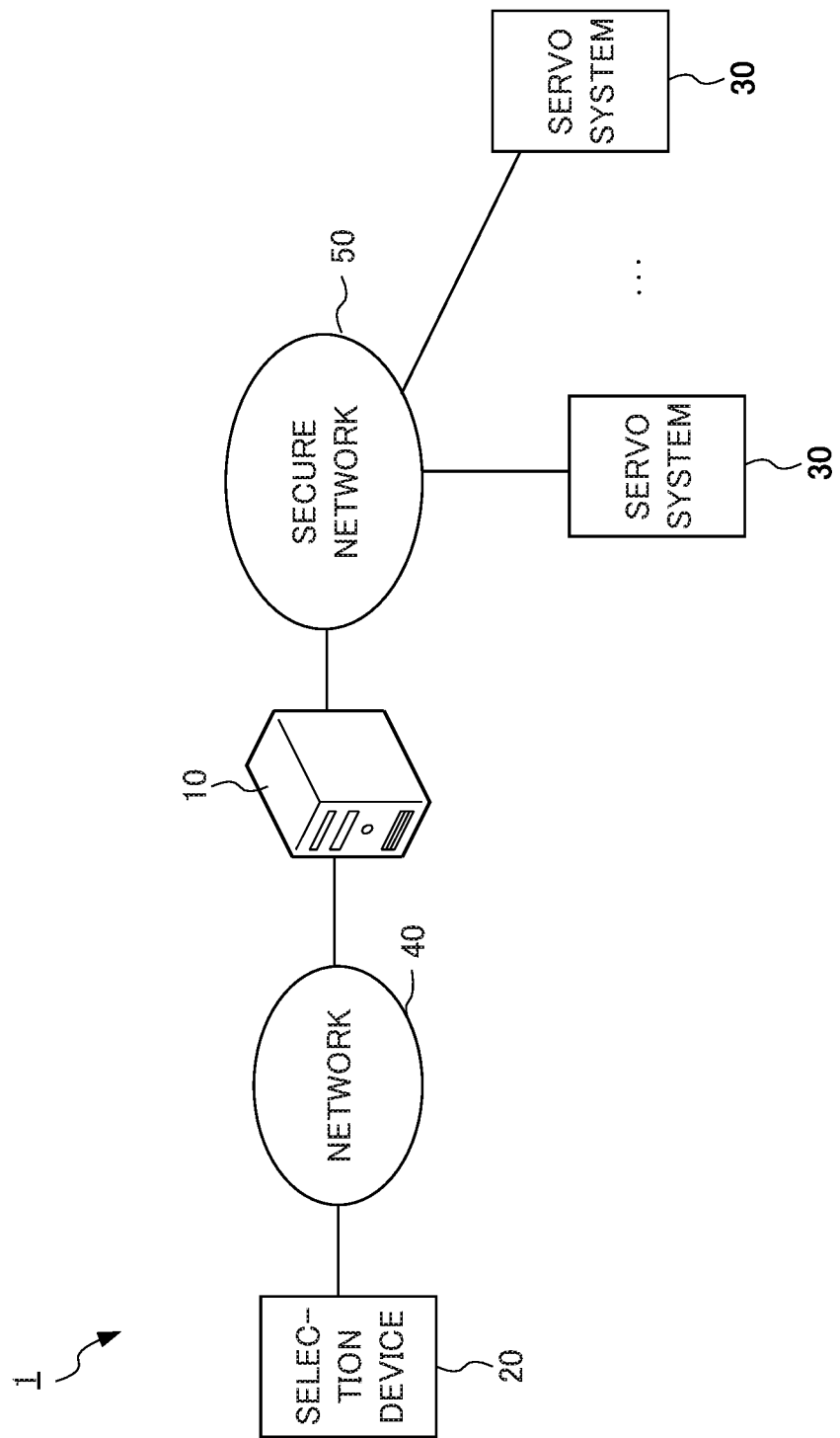
FIG. 1 is a schematic view showing the system configuration of a servo amplifier selection system according to an embodiment of the present invention.

FIG. 1 is a schematic view showing the system configuration of a servo amplifier selection system 1 according to an embodiment of the present invention. As shown in FIG. 1, the servo amplifier selection system 1 includes a management device 10, a selection device 20 and a plurality of servo systems 30, and the management device 10 and the selection device 20 can communicate with each other through a network 40 such as the Internet. The management device 10 and the servo systems 30 can communicate with each other through a secure network 50. Specifically, only a device (for example, the management device) which is allowed to communicate with the servo systems 30 can communicate with the servo systems 30 through the secure network 50.

The management device 10 stores the specification data of the servo systems 30 which is a target to be managed.

Furthermore, the management device 10 sequentially collects, through the secure network 50, information on the operations of the servo systems 30 which are operated, and stores the histories of the operations of the servo systems 30. The histories of the operations of the servo systems 30 include the histories of operations at the time of operation and the histories of operations at the time of power failure. When the management device 10 receives a transmission request from the selection device 20 or the servo system 30 for various types of information (for example, the specification data of the servo systems 30 and the data of the histories thereof) which are managed, the management device 10 transmits the requested information to the selection device 20 or the servo system 30.

The selection device 20 stores the specification data of the servo systems which are candidates to be selected as a servo system 30A (not shown). The specification data of the servo system includes the specification data of a servo motor and a spindle motor and the specification data of a servo amplifier and a spindle amplifier. The selection device 20 receives inputs of machine conditions which are requested for the servo system 30 to be selected, references the specification data of the servo system which is stored and thereby selects the configuration of the servo system 30. As a method of selecting the configuration of the servo system 30A, for example, the method of selecting the motor system disclosed in Japanese unexamined patent application, publication No. 2017-093209 can be used, and moreover, various types of existing selection methods such as those disclosed in Japanese unexamined patent application, publication Nos. 2017-093265 and 2011-166953 can be used.

The selection device 20 also receives inputs of setting conditions of a power failure operation for the selected servo system 30A, references the specification data of the selected servo system 30A and thereby calculates, for the setting conditions, a current (necessary current) necessary for an operation at the time of power failure, the total (rotational energy total) of rotational energy necessary for the operation at the time of power failure and consumption energy (separation consumption energy) for separating a movable coupling unit at the time of power failure. Then, the selection device 20 determines a method for the power failure operation in the selected servo system 30A. Specifically, the selection device 20 determines which one of a power failure operation by software and a power failure operation by hardware is appropriate as the method for the power failure operation, and determines the number of control power supply holding units, the number of regenerative discharge units and the number of DC link voltage holding units necessary for the power failure operation (hereinafter also referred to as "necessary configuration conditions at the time of power failure"). The selection device 20 displays, on a user interface screen (UI screen), the necessary configuration conditions at the time of power failure which are determined. Furthermore, as will be described later, the selection device 20 transmits transmission requests for various types of information mainly related to the power failure and the power failure operation on the servo systems 30 managed in the management device 10, and thereby can acquire the various types of information which are transmitted from the management device 10 according to the requests.

Figure 2:
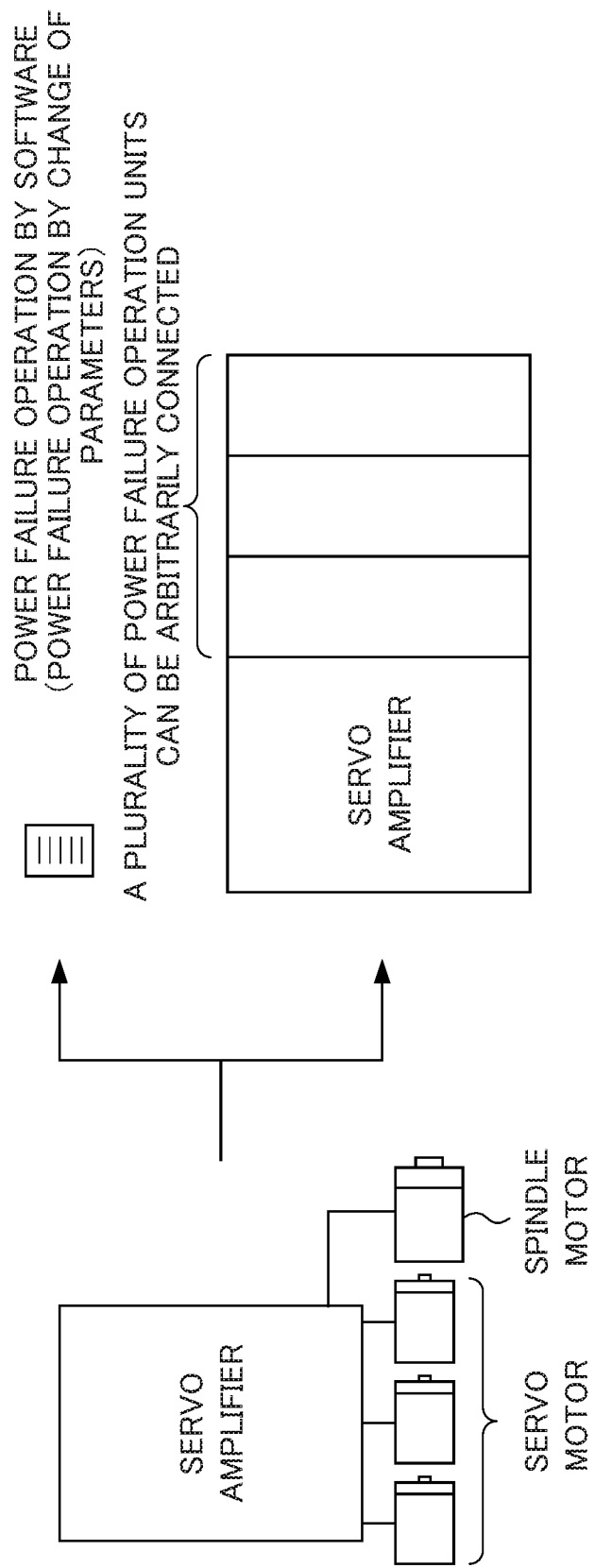
FIG. 2 is a schematic view showing a conception of a power failure operation in a servo system 30.

FIG. 2 is a schematic view showing a conception of the power failure operation in the servo system 30A. As shown in FIG. 2, when the power failure operation in the servo system 30A is performed, it is necessary to determine which one of the power failure operation by software (power failure operation by change of parameters) and the power failure operation by hardware (power failure operation by installation of a power failure operation unit) is appropriate. In general, although in the measure by software, it is not necessary to add the power failure operation unit, when a large amount of energy is needed for the operation at the time of power failure or when a large number of operations are performed, it is likely that the measure by software cannot be used. On the other hand, although in the power failure operation unit, it is necessary to add hardware, it is possible to perform an operation requiring a large amount of energy and a large number of operations. Hence, with consideration given to various types of conditions for the specifications of a motor in the servo system 30A and the details of the operation at the time of power failure, it is necessary to appropriately set a configuration (necessary configuration conditions at the time of power failure) for the power failure operation.

In the present embodiment, the power failure operation by software is realized by operation settings at the time of power failure on the control software of the servo system 30A installed in a CNC. Specifically, a user who designs the servo system inputs, according to the design, parameters to the control software of the servo system 30A installed in the CNC, and thus the power failure operation by software is realized. For example, according to the parameters set by the user, the details of control of the voltage of the DC link voltage holding unit which will be described later are changed. Consequently, at the time of power failure, according to the parameters set by the user, operations such as the separation of the movable coupling unit and the stop of the motor are performed.

Figure 3:
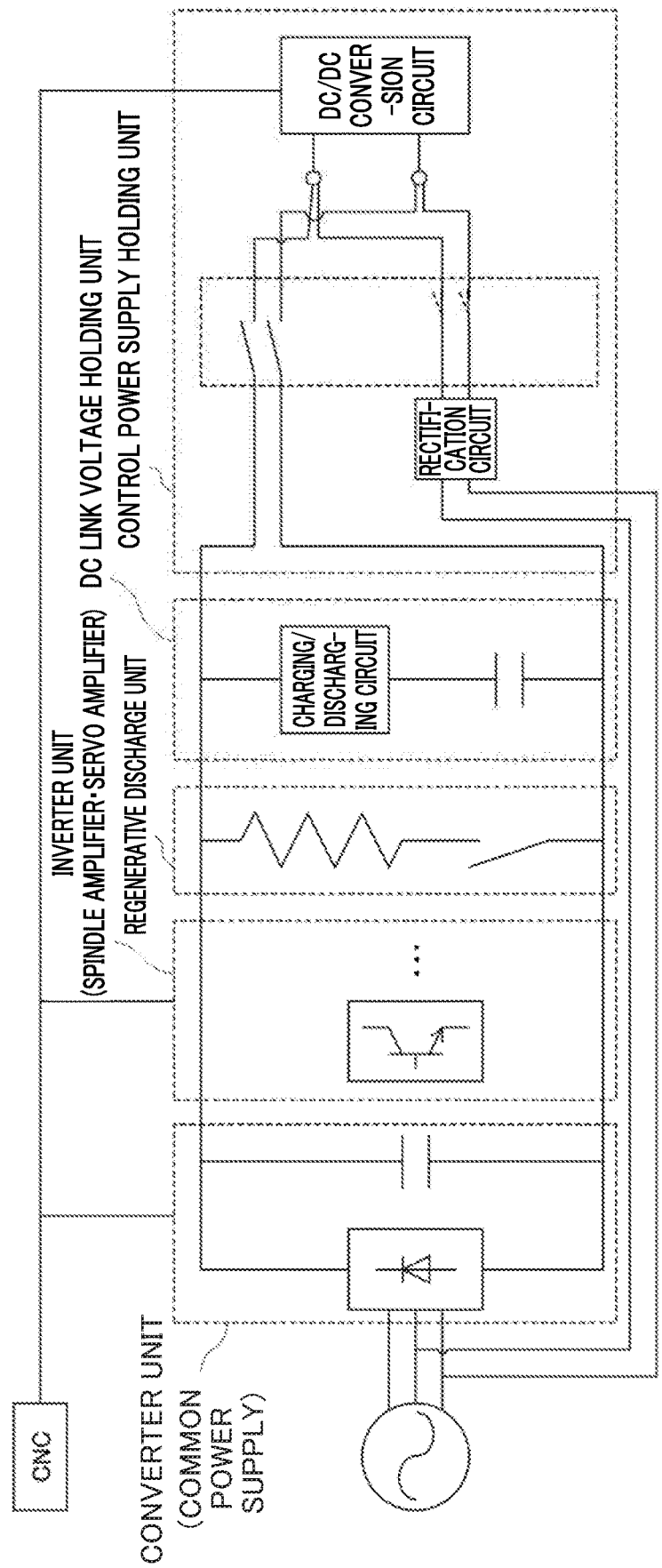
FIG. 3 is a schematic view showing an example of the configuration of a power failure operation unit.

FIG. 3 is a schematic view showing an example of the configuration of the power failure operation unit. As shown in FIG. 3, the power failure operation unit includes: a converter unit which severs as a common power supply; an inverter unit which includes the servo amplifier and the spindle amplifier; the regenerative discharge unit for the safety stop of the motor at the time of power failure; the DC link voltage holding unit for the safety displacement of a machine (such as a coupling movable unit) at the time of power failure; and the control power supply holding unit which serves as a control power supply at the time of power failure. Among them, with respect to the regenerative discharge unit, the DC link voltage holding unit and the control power supply holding unit, the appropriate numbers and combinations thereof are changed according to the type, the number, the application and the like of the servo amplifier included in the servo system 30A. Hence, when the power failure operation unit is used, it is required to appropriately determine, according to the selected servo system 30A and the setting conditions in the operation at the time of power failure, what configuration is adopted for the power failure operation unit.

In FIG. 1, a plurality of servo systems 30 are servo systems which are incorporated in a plurality of production lines and which are actually operated, and include the servo motors, the servo amplifiers, the spindle motors, the spindle amplifiers and the like. The specification data of the individual servo systems 30 and the histories of operations at the time of operation and at the time of power failure are transmitted as necessary from the servo systems 30 to the management device 10 through the secure network 50.

Figure 4:
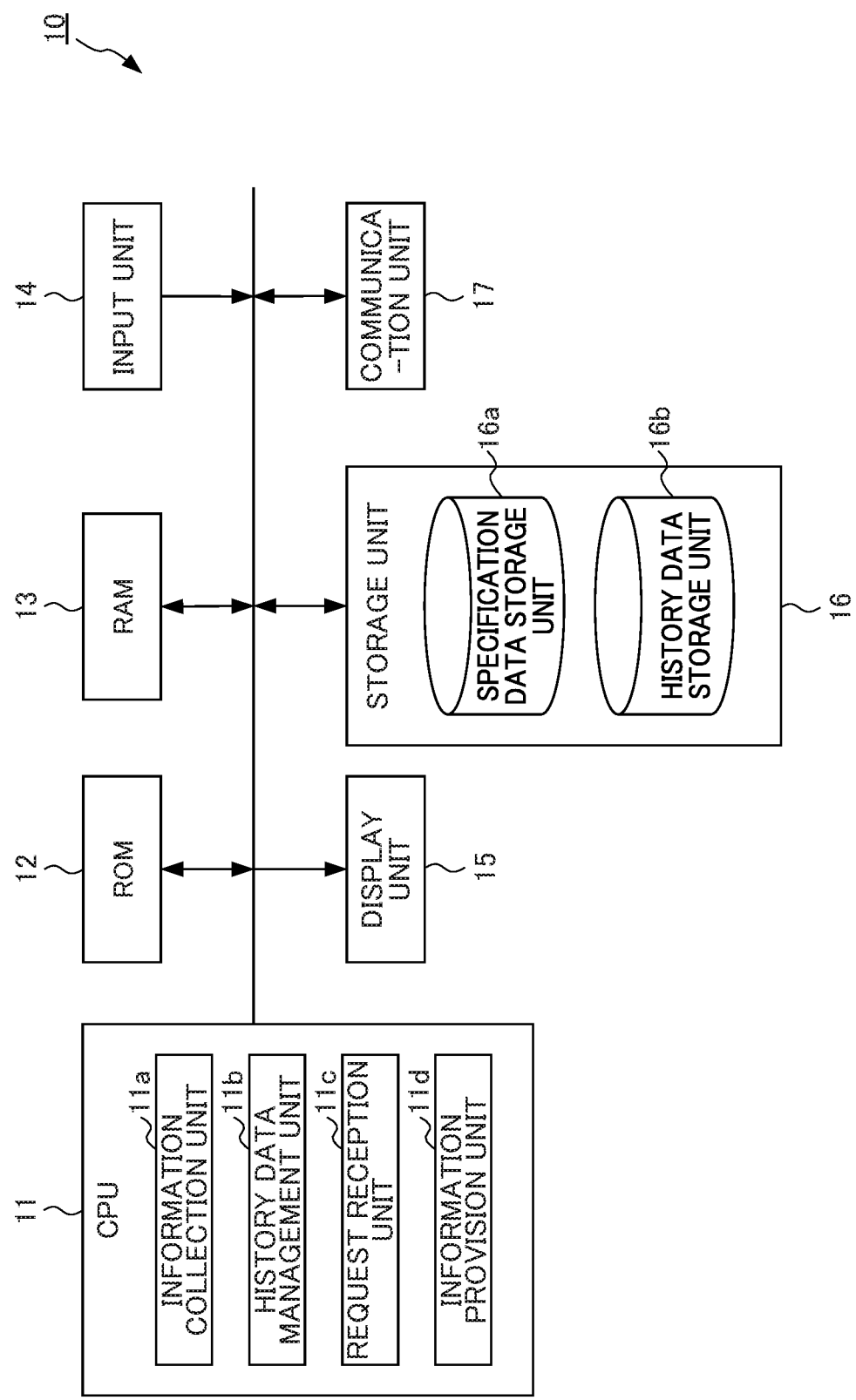
FIG. 4 is a block diagram showing the configuration of a management device in the embodiment of the present invention.

The configurations of the management device 10 and the selection device 20 will then be described. FIG. 4 is a block diagram showing the configuration of the management device 10 in the embodiment of the present invention. As shown in FIG. 4, the management device 10 includes a CPU (Central Processing Unit) 11, a ROM 12, a RAM 13, an input unit 14, a display unit 15, a storage unit 16 and a communication unit 17.

The CPU 11 executes various types of programs stored in the storage unit 16 so as to control the entire management device 10. For example, the CPU 11 collects information from the servo systems 30, and executes, according to transmission requests for various types of information from the selection device 20 or the servo systems 30, programs for processing (hereinafter also referred to as "system management processing") which transmits the requested information. The CPU 11 executes the programs for the system management processing so as to form, as a functional configuration, an information collection unit 11a, a history data management unit 11b, a request reception unit 11c and an information provision unit 11d.

The information collection unit 11a collects, from the servo systems 30 managed in the management device 10, the histories of operations at the time of operation and the histories of operations at the time of power failure. The history data management unit 11b associates the histories of the operations at the time of operation and the histories of the operations at the time of power failure in the servo systems 30 collected by the information collection unit 11a with information for identifying the servo systems 30, and stores them in a history data storage unit 16b. The request reception unit 11c receives, from the selection device 20 or the servo systems 30, the transmission requests for various types of information which are managed in the management device 10. The information provision unit 11d transmits, according to the transmission requests received in the request reception unit 11c, the requested information to the selection device 20 or the servo systems 30.

In the ROM 12, various types of system programs for controlling the management device 10 are previously written. The RAM 13 is formed with a semiconductor memory such as a DRAM (Dynamic Random Access Memory), and stores data which is generated when the CPU 11 executes various types of processing. The input unit 14 is formed with an input device such as a keyboard, a mouse or a touch sensor, and receives inputs of various types of information from the user (such as a system manager) to the management device 10.

The display unit 15 is formed with a display device such as an LCD (Liquid Crystal Display), and displays the results of various types of processing in the management device 10. The storage unit 16 is formed with a nonvolatile storage device such as a hard disk or a flash memory, and stores programs for the system management processing and the like. In the storage unit 16, a specification data storage unit 16a for storing the specification data of the servo systems 30 and the history data storage unit 16b for storing the data of the histories of the operations in the servo systems 30 (the histories of the operations at the time of operation and at the time of power failure) are individually formed. The communication unit 17 includes a communication interface such as a wired or wireless LAN or a USB in which signal processing is performed based on predetermined communication standards, and controls communication which is performed by the management device 10 with other devices.

Figure 5:
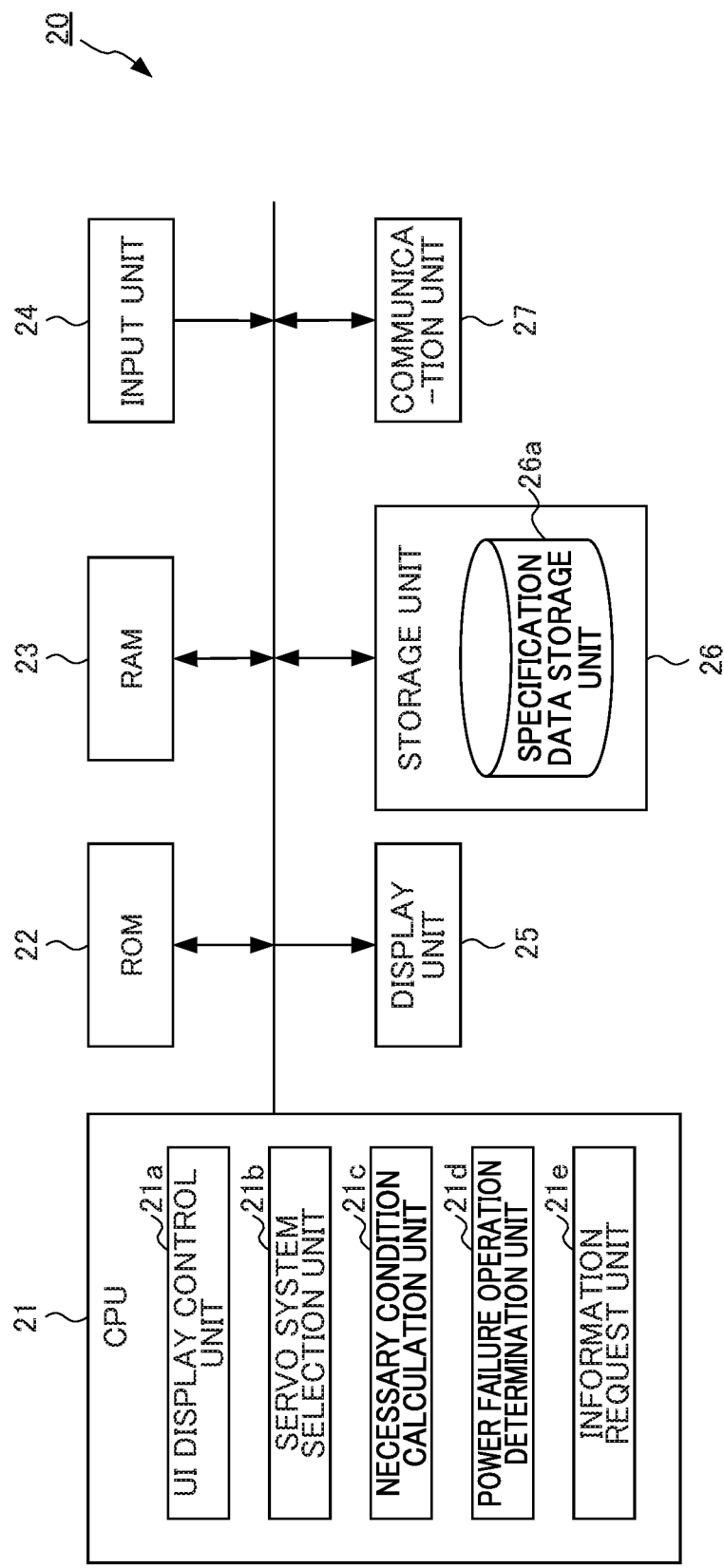
FIG. 5 is a block diagram showing the configuration of a selection device in the embodiment of the present invention.

The configuration of the selection device 20 will then be described. FIG. 5 is a block diagram showing the configuration of the selection device 20 in the embodiment of the present invention. As shown in FIG. 5, the selection device 20 includes a CPU 21, a ROM 22, a RAM 23, an input unit 24, a display unit 25, a storage unit 26 and a communication unit 27.

The CPU 21 executes various types of programs stored in the storage unit 26 so as to control the entire selection device 20. For example, the CPU 21 selects the servo system corresponding to the request of the user, and executes programs for processing (hereinafter also referred to as "power failure necessary condition output processing") which outputs the necessary configuration conditions at the time of power failure for the selected servo motor. The CPU 11 executes the programs for the power failure necessary condition output processing so as to form, as a functional configuration, a user interface (UI) display control unit 21a, a servo system selection unit 21b, a necessary condition calculation unit 21c, a power failure operation determination unit 21d and an information request unit 21e.

The UI display control unit 21a receives inputs of various types of information from the user, and displays, on the display unit 25, a user interface (UI) screen for displaying various types of information including the results of the power failure necessary condition output processing. On the UI screen, for example, machine conditions requested for the servo system 30A to be selected (selection conditions of the servo system) and setting conditions of the power failure operation for the selected servo system 30A are input. On the UI screen, the configuration of the selected servo system 30A and the necessary configuration conditions at the time of power failure are displayed.

The servo system selection unit 21b references, based on the machine conditions which are input on the UI screen and which are requested for the servo system 30A to be selected, the specification data of the servo system stored in a specification data storage unit 26a so as to select the configuration of the servo system 30A (system configuration including the servo motor and the servo amplifier).

Based on the setting conditions of the power failure operation for the selected servo system 30A (setting conditions input on the UI screen) and the specification data of the selected servo system 30A, the necessary condition calculation unit 21c calculates, for the setting conditions, parameters for determining the necessary configuration conditions at the time of power failure. Specifically, the necessary condition calculation unit 21c calculates, as the parameters for determining the necessary configuration conditions at the time of power failure, the current (necessary current) necessary for the operation at the time of power failure, the total (rotational energy total) of rotational energy necessary for the operation at the time of power failure, the consumption energy (separation consumption energy) for separating the movable coupling unit at the time of power failure and energy (necessary backup energy) necessary for the backup of the inverter unit (control power supply).

Here, the current (necessary current) necessary for the operation at the time of power failure can be calculated as the total value of the current capacities of the inverter units (control power supplies). The total (rotational energy total) of rotational energy necessary for the operation at the time of power failure can be calculated as the total value for the number of motors after rotational energy W [J] for one motor is determined in the international system of units as formula (1) below.

$$W = 5.48 \times 10^3 (Jm + JL) \times Vm^2 \tag{1}$$

In formula (1), $Jm$ represents the rotor inertia of the motor [kg·m$^2$], $JL$ represents the motor axis conversion inertia of a load [kg·m$^2$] and $Vm$ represents the number of revolutions of the motor in fast forward [min$^{-1}$].

The consumption energy (separation consumption energy) for separating the movable coupling unit at the time of power failure can be calculated as the total of (A) energy W2 [J] necessary for cutting until the start of the separation after the occurrence of the power failure and (B) energy W3 [J] necessary for moving an axis to be separated. Specifically, (A) the energy W2 [J] can be calculated in the international system of units as follows.

$$W2 = 32 \times P2 \tag{2}$$

In formula (2), P2 represents the maximum cutting output [kW] before the occurrence of the power failure and can be calculated from a motor conversion axis torque Tm [N·m] at the time of the maximum cutting and the number of revolutions of the motor n [min$^{-1}$] as formula (3) below.

$$P2 = 1.047 \times 10^{-4} \times n \times Tm \quad (3)$$

(B) the energy W3 [J] can be calculated in the international system of units as follows.

$$W3 = 5.48 \times 10^3 (Jm + JL) \times Vm^2 + 6.28 \times TL \times d/L \quad (4)$$

In formula (4), Jm represents the rotor inertia of the motor [kg·m$^2$], JL represents the motor axis conversion inertia of the load [kg·m$^2$], Vm represents the number of revolutions of the motor in fast forward [min$^{-1}$], TL represents friction torque (motor conversion value) [N·m] of a machine in the case of a horizontal axis whereas TL represents torque (motor conversion value) [N·m] necessary in fast-forward rise in the case of a gravity axis, d represents a distance [mm] up to a position in which a workpiece does not interfere with a tool and L represents the amount of movement [mm/rev] per revolution of the motor.

The energy (necessary backup energy)) W4 [J] necessary for the backup of the inverter unit (control power supply) can be calculated in the international system of units as follows.

$$W4 = Is \times Vd \times 1.2 \times t \quad (5)$$

In formula (5), Is represents the supply current [A] of the DC link voltage holding unit, and t represents a time [s] during which the movable coupling unit is separated.

The power failure operation determination unit 21d determines the number of control power supply holding units, the number of regenerative discharge units and the number of DC link voltage holding units (necessary configuration conditions at the time of power failure) necessary for the power failure operation. Then, the power failure operation determination unit 21d displays, on the user interface screen (UI screen), the necessary configuration conditions at the time of power failure which are determined.

Here, the number of control power supply holding units necessary for the power failure operation is determined by a relationship between the total value of the current capacities of the inverter units (control power supplies) and the current capacity of the control power supply holding unit. Specifically, the number of control power supply holding units is selected such that the current capacity of the control power supply holding unit is equal to or more than the total value of the current capacities of the inverter units (control power supplies).

The number of regenerative discharge units necessary for the power failure operation is determined by a relationship between individual conditions of (condition 1) the sum of the maximum outputs of the individual motors whose speeds are simultaneously slowed down at the time of power failure and (condition 2) the total (rotational energy total) of rotational energy necessary for the operation at the time of power failure and threshold values for the individual conditions which are previously set for each of the regenerative discharge units. Specifically, the number of regenerative discharge units is determined such that the sum of the maximum outputs of the individual motors whose speeds are simultaneously slowed down at the time of power failure is equal to or less than a threshold value for an output which is previously set for each of the regenerative discharge units and that the total (rotational energy total) of rotational energy necessary for the operation at the time of power failure is equal to or less than a threshold value for rotation energy which is previously set for each of the regenerative discharge units.

The number of DC link voltage holding units necessary for the power failure operation is selected so as to be equal to or more than a value obtained by dividing the total (W2+W3+W4) of the consumption energy (separation consumption energy) for separating the movable coupling unit at the time of power failure and the energy (necessary backup energy) necessary for the backup of the inverter unit (control power supply) by (the amount of energy that can be supplied by each of the DC link voltage holding units×0.7). The information request unit 21e transmits transmission requests for various types of information (such as the histories of operations of the servo systems 30) which are managed in the management device 10, and acquires the various types of information which are transmitted according to the transmission requests from the management device 10.

In the ROM 22, various types of system programs for controlling the selection device 20 are previously written. The RAM 23 is formed with a semiconductor memory such as a DRAM, and stores data which is generated when the CPU 21 executes various types of processing. The input unit 24 is formed with an input device such as a keyboard, a mouse or a touch sensor, and receives inputs of various types of information from the user (such as an operator for selecting the servo system) to the selection device 20.

The display unit 25 is formed with a display device such as an LCD, and displays the results of various types of processing in the selection device 20. The storage unit 26 is formed with a nonvolatile storage device such as a hard disk or a flash memory, and stores programs for the system management processing and the like. In the storage unit 26, the specification data storage unit 26a for storing the specification data of the servo systems 30 which are candidates to be selected as the servo system 30 is formed. The communication unit 27 includes a communication interface such as a wired or wireless LAN or a USB in which signal processing is performed based on predetermined communication standards, and controls communication which is performed by the selection device 20 with other devices.

[Examples of Display of UI Screen]

Figure 6:
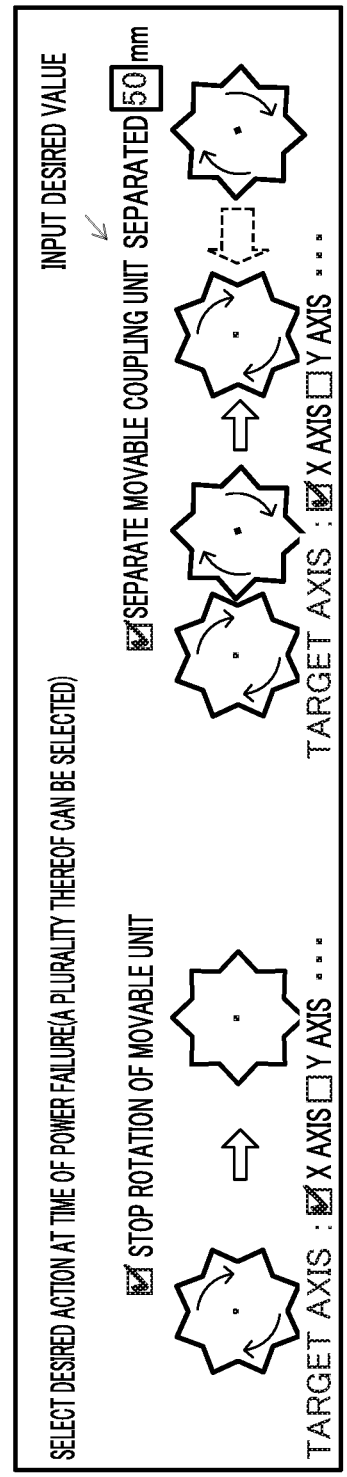
FIG. 6 is a schematic view showing an example of a UI screen for inputting the setting conditions of the power failure operation for the selected servo system.

FIG. 6 is a schematic view showing an example of the UI screen for inputting the setting conditions of the power failure operation for the selected servo system 30A. As shown in FIG. 6, on the UI screen in which the setting conditions of the power failure operation are input, the user is prompted to input a desired operation that is performed at the time of power failure. For example, on the UI screen shown in FIG. 6, a display operation is conducted so as to prompt the user to specify whether or not the rotation of the movable unit is stopped, to specify an axis whose rotation is stopped, to specify whether or not the movable coupling unit (such as a gear) is separated, to specify an axis which is separated and to input a distance when it is separated. In FIG. 6, inputs are made in which the rotation of the movable unit is stopped, in which the axis whose rotation is stopped is an "X axis", in which the movable coupling unit is separated, in which the axis that is separated is the "X axis" and in which the separation distance is "50 mm". On the UI screen, the user inputs conditions which are set for the power failure operation of the selected servo system 30A.

Figure 7:
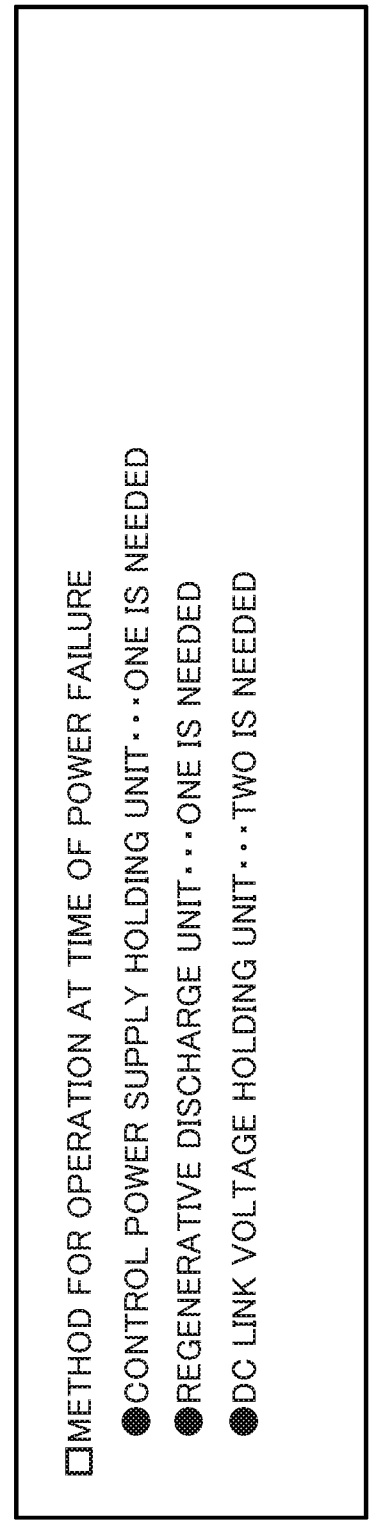
FIG. 7 is a schematic view showing an example of necessary configuration conditions at the time of power failure which are displayed for the input example of FIG. 6.

FIG. 7 is a schematic view showing an example of the necessary configuration conditions at the time of power failure which are displayed for the input example of FIG. 6. On the UI screen shown in FIG. 7, a display is produced saying that as a method for the power failure operation, one control voltage holding unit is needed, in which one regenerative discharge unit is needed and in which two DC link voltage holding units are needed. The number of control voltage holding units is calculated from a current which is necessary for the operation set as the power failure operation. The number of regenerative discharge units is calculated from the number of axes whose rotation is stopped at the time of power failure and rotational energy. Furthermore, the number of DC link voltage holding units is calculated from the number of axes which are separated at the time of power failure and energy which is necessary for the separation.

Figure 8:
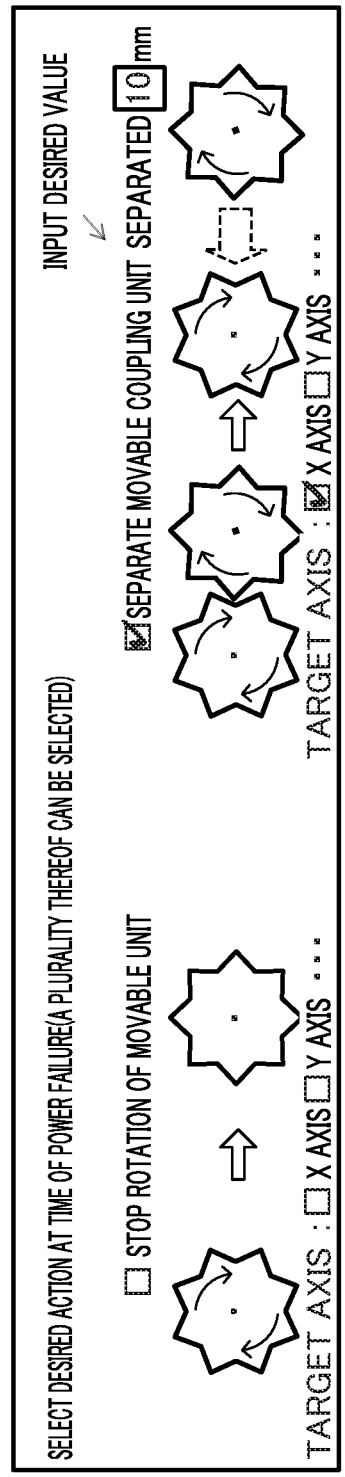
FIG. 8 is a schematic view showing another example of the UI screen for inputting the setting conditions of the power failure operation for the selected servo system.

FIG. 8 is a schematic view showing another example of the UI screen for inputting the setting conditions of the power failure operation for the selected servo system 30A. On the UI screen shown in FIG. 8, as in FIG. 6, a display operation is conducted so as to prompt the user to specify whether or not the rotation of the movable unit is stopped, to specify an axis whose rotation is stopped, to specify whether or not the movable coupling unit (such as a gear) is separated and to input a distance when it is separated. In the example of FIG. 8, inputs are made in which the movable coupling unit is separated, in which the axis that is separated is the "X axis" and in which the separation distance is "10 mm", and an input is not made in which the rotation of the movable unit is stopped (in other words, the rotation of the movable unit is not stopped).

FIG. 9 is a schematic view showing an example of the necessary configuration conditions at the time of power failure which are displayed for the input example of FIG. 8. On the UI screen shown in FIG. 9, a display is produced saying that as a method for the power failure operation, one control voltage holding unit is needed, in which the regenerative discharge unit is not needed, in which the DC link voltage holding unit is not needed and in which a measure by software needs to be performed (instruction for setting a parameter).

[Operations]

The operations of the management device 10 and the selection device 20 will then be described.

[System Management Processing]

Figure 10:
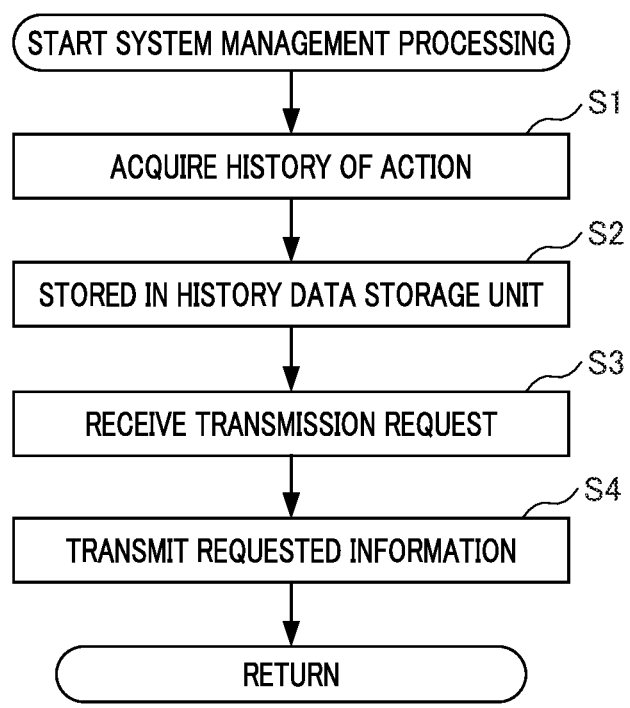
FIG. 10 is a flowchart illustrating the flow of system management processing which is performed by the management device.

FIG. 10 is a flowchart illustrating the flow of the system management processing which is performed by the management device 10. The system management processing is started together with the startup of the management device 10 and is repeatedly performed until an instruction for stopping the system management processing is provided.

In step S1, the information collection unit 11a collects the histories of the operations at the time of operation and the histories of the operations at the time of power failure from the servo systems 30 managed in the management device 10. In step S2, the history data management unit 11b associates the histories of the operations at the time of operation and the histories of the operations at the time of power failure in the servo systems 30 collected by the information collection unit 11a with information for identifying the servo systems 30, and stores them in the history data storage unit 16b.

In step S3, the request reception unit 11c receives, from the selection device 20 or the servo systems 30, the transmission requests for various types of information which are managed in the management device 10. In step S4, the information provision unit 11d transmits, according to the transmission requests received in the request reception unit 11c, the requested information to the selection device 20 or the servo systems 30. After step S4, the system management processing is repeated.

[Power Failure Necessary Condition Output Processing]

Figure 11:
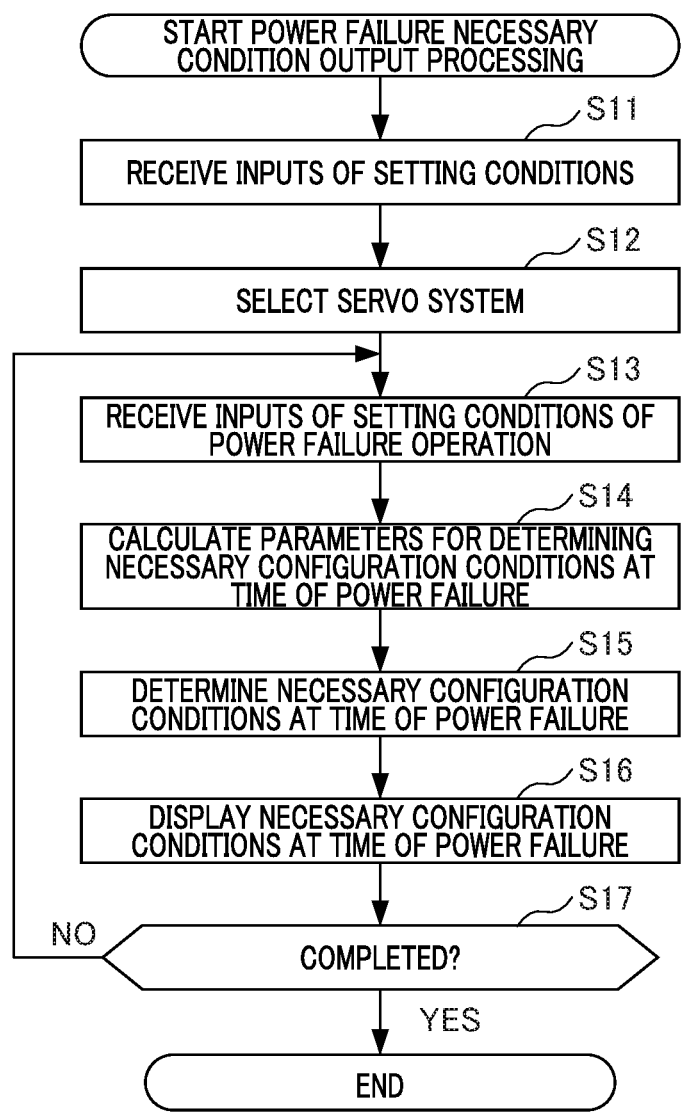
FIG. 11 is a flowchart illustrating the flow of power failure necessary condition output processing which is performed by the selection device.

FIG. 11 is a flowchart illustrating the flow of the power failure necessary condition output processing which is performed by the selection device 20. The power failure necessary condition output processing is started by provision of an instruction for performing the power failure necessary condition output processing in the selection device 20. In step S11, the UI display control unit 21a receives, on the UI screen, inputs of machine conditions requested for the servo system 30A to be selected (selection conditions of the servo system). In step S12, based on the machine conditions which are input on the UI screen and which are requested for the servo system 30A to be selected, the servo system selection unit 21b references the specification data of the servo system stored in the specification data storage unit 26a so as to select the configuration of the servo system 30A.

In step S13, the UI display control unit 21a receives, on the UI screen, inputs of setting conditions of the power failure operation for the selected servo system 30A. In step S14, based on the setting conditions of the power failure operation for the selected servo system 30A (setting conditions input on the UI screen) and the specification data of the selected servo system 30A, the necessary condition calculation unit 21c calculates, for the setting conditions, parameters for determining the necessary configuration conditions at the time of power failure. Specifically, the necessary condition calculation unit 21c calculates, as the parameters for determining the necessary configuration conditions at the time of power failure, the current (necessary current) necessary for the operation at the time of power failure, the total (rotational energy total) of rotational energy necessary for the operation at the time of power failure, the consumption energy (separation consumption energy) for separating the movable coupling unit at the time of power failure and energy (necessary backup energy) necessary for the backup of the inverter unit (control power supply).

In step S15, the power failure operation determination unit 21d determines the number of control power supply holding units, the number of regenerative discharge units and the number of DC link voltage holding units (necessary configuration conditions at the time of power failure) necessary for the power failure operation. In step S16, the power failure operation determination unit 21d displays, on the UI screen, the necessary configuration conditions at the time of power failure which are determined.

In step S17, the UI display control unit 21a determines whether or not an instruction for completing the power failure necessary condition output processing is provided. When an instruction for completing the power failure necessary condition output processing is not provided, in step S17, the determination is no, and the processing transfers to step S13. On the other hand, when an instruction for completing the power failure necessary condition output processing is provided, in step S17, the determination is yes, and the power failure necessary condition output processing is completed.

As described above, when the servo system 30A is selected, the servo amplifier selection system 1 according to the present embodiment receives inputs of setting conditions of the power failure operation for the servo system 30A. Then, the servo amplifier selection system 1 references the specification data of the selected servo system 30A, and thereby calculates, for the setting conditions, the current (necessary current) necessary for the operation at the time of power failure, the total (rotational energy total) of rotational energy necessary for the operation at the time of power failure and the consumption energy (separation consumption energy) for separating the movable coupling unit at the time of power failure. Furthermore, the servo amplifier selection system 1 determines the number of control power supply holding units, the number of regenerative discharge units and the number of DC link voltage holding units (necessary configuration conditions at the time of power failure) necessary for the power failure operation. Then, the servo amplifier selection system 1 displays, on the UI screen of the selection device 20, the necessary configuration conditions at the time of power failure which are determined.

In this way, based on the specification data of the selected servo system 30A, information indicating the power failure operation with consideration given to the appropriateness of the power failure operation such as the safety of the operation at the time of power failure and ease of restoration can be provided to the user. Hence, it is possible to realize the technology in which when the configuration of the servo system 30A is selected, a more appropriate power failure operation can be performed.

Second Embodiment

A second embodiment of the present invention will then be described. The servo amplifier selection system 1 according to the present embodiment differs from the servo amplifier selection system 1 of the first embodiment in that a function is added in which when inputs of setting conditions of the power failure operation are received in the selection device 20, the information stored in the management device 10 is referenced and in which the situation of occurrence of a power failure and the effect of the power failure operation (in particular, an effect caused by whether or not the power failure operation unit is present) in a place where the selected servo system 30 is installed are displayed. Hence, a description will be mainly given of parts different from the first embodiment, and for the other parts, the description in the first embodiment is referenced.

In the present embodiment, the history data management unit 11b of the management device 10 generates, from the histories of the operations at the time of power failure in a plurality of servo systems 30, a database of power failure information (hereinafter also referred to as "power failure information database") which indicates, for each area, the situation of occurrence of a power failure and the number of servo systems 30 that are restored by the power failure operation. The history data management unit 11b stores the generated power failure information database in the history data storage unit 16b. The generation of the power failure information database can be performed, for example, in step S2 of the system management processing shown in FIG. 10.

Then, when the request reception unit 11c of the management device 10 receives, from the selection device 20, a transmission request for information (hereinafter also referred to as "power failure operation auxiliary information") for assisting the power failure operation in the selected servo system 30A, the information provision unit 11d of the management device 10 acquires, from the power failure information database, power failure information in a place (area) where the servo system 30A corresponding to the transmission request is planned to be installed and transmits it as the power failure operation auxiliary information to the selection device 20. The power failure operation auxiliary information is information which is indicated as a value indicating the effect of the power failure operation or in a form such as a comment, and data serving as determination material for determination of the power failure operation by the user or recommendation information indicating the power failure operation recommended by the servo amplifier selection system 1 is provided. The transmission of the power failure operation auxiliary information can be performed, for example, in step S4 of the system management processing shown in FIG. 10.

The information request unit 21e of the selection device 20 transmits the transmission request for the power failure operation auxiliary information corresponding to the selected servo system 30A to the management device 10, and acquires the power failure operation auxiliary information which is transmitted from the management device 10 according to the request. Here, the transmission request which is transmitted includes the place where the servo system 30A is planned to be installed. The transmission request and the acquisition of the power failure operation auxiliary information can be performed, for example, in step S13 of FIG. 11.

FIG. 12 is a schematic view showing an example of the UI screen for inputting the setting conditions of the power failure operation for the selected servo system 30A in the present embodiment. On the UI screen shown in FIG. 12, as the power failure operation, an icon ("confirmation" button) for displaying the power failure operation auxiliary information is displayed together with a character string of "confirmation of power failure operation auxiliary information" on a screen which prompts the user to input whether or not the power failure operation unit is installed. On the UI screen shown in FIG. 12, a display operation is conducted which prompts the user to input the place where the selected servo system 30A is planned to be installed (delivered).

When on the UI screen shown in FIG. 12, the user inputs the place where the servo system 30A is planned to be installed (delivered), and operates the icon for displaying the power failure operation auxiliary information, the information request unit 21e of the selection device 20 transmits the transmission request for the power failure operation auxiliary information to the management device 10, and the power failure operation auxiliary information is transmitted from the management device 10 accordingly. FIG. 13 is a schematic view showing an example of the UI screen on which the power failure operation auxiliary information is displayed. On the UI screen shown in FIG. 13, the number of stops of systems caused by power failures in "Tokyo Japan" which is the place where the servo system 30A is planned to be delivered and the number of systems which are safely restored by the power failure operation units are displayed as the power failure operation auxiliary information. The user references the power failure operation auxiliary information on the UI screen shown in FIG. 13, and thereby can input whether or not the addition of the power failure operation unit is needed.

As described above, in the servo amplifier selection system 1 of the present embodiment, when inputs of setting conditions of the power failure operation are received in the selection device 20, the information managed in the management device 10 is referenced, and the power failure operation auxiliary information indicating the situation of occurrence of the power failure and the effect of the power failure operation (in particular, the effect caused by whether or not the power failure operation unit is present) in the place where the selected servo system 30 is installed and the like is displayed. Hence, the user references the power failure operation auxiliary information and thereby can determine whether or not the addition of the power failure operation unit is needed. Therefore, it is possible to realize the technology in which when the configuration of the servo system 30A is selected, a more appropriate power failure operation can be performed.

Third Embodiment

A third embodiment of the present invention will then be described. A servo amplifier selection system 1 according to the present embodiment generates, for each area and for each of classifications (such as the system configurations or the types) of the servo systems 30, a power failure information database which stores power failure information indicating the situation of occurrence of the power failure and the number of servo systems 30 which are restored by the power failure operation. The servo amplifier selection system 1 according to the present embodiment also generates, for each of classifications of the servo systems 30, a database of hazard information (hereinafter also referred to as a "hazard information database") indicating failures which can occur at the time of power failure. The servo amplifier selection system 1 according to the present embodiment differs from the servo amplifier selection systems 1 according to the first and second embodiments in that the function of displaying the place where the selected servo system 30 is installed, the possibility of occurrence of hazard information at the time of power failure in the classification of the servo system 30 and a recommended measure for avoiding the hazard is added to the servo amplifier selection systems 1 according to the first and second embodiments. Hence, a description will be mainly given of parts different from the first and second embodiments, and for the other parts, the description in the first and second embodiments is referenced.

In the present embodiment, the history data management unit 11b of the management device 10 generates, from the histories of the operations at the time of power failure in a plurality of servo systems 30, a database of power failure information (power failure information database) which indicates, for each area and for each of classifications of the servo systems 30, the situation of occurrence of the power failure and the number of servo systems 30 that are restored by the power failure operation. The history data management unit 11b stores the generated power failure information database in the history data storage unit 16b. The generation of the power failure information database can be performed, for example, in step S2 of the system management processing shown in FIG. 10. The history data management unit 11b of the management device 10 also generates, from the histories of the operations at the time of power failure in the servo systems 30, the database of hazard information (hazard information database) indicating failures which can occur at the time of power failure. The history data management unit 11b stores the generated hazard information database in the history data storage unit 16b. The generation of the hazard information database can be performed, for example, in step S2 of the system management processing shown in FIG. 10.

Then, when the request reception unit 11c of the management device 10 receives the transmission request for the information (power failure operation auxiliary information) for assisting the power failure operation in the selected servo system 30A, the information provision unit 11d of the management device 10 acquires, from the power failure information database, the place (area) where the servo system 30A is installed corresponding to the transmission request and power failure information corresponding to the classification of the servo system 30A. The information provision unit 11d of the management device 10 also acquires, from the hazard information database, the place (area) where the servo system 30A is installed corresponding to the transmission request and hazard information in the classification of the servo system 30. Then, the information provision unit 11d of the management device 10 transmits the power failure information and the hazard information acquired to the selection device 20 as the power failure operation auxiliary information. The transmission of the power failure operation auxiliary information can be performed, for example, in step S4 of the system management processing shown in FIG. 10.

The information request unit 21e of the selection device 20 transmits the transmission request for the power failure operation auxiliary information corresponding to the selected servo system 30A to the management device 10, and acquires the power failure operation auxiliary information which is transmitted from the management device 10 according to the request. The transmission request transmitted here includes the place where the servo system 30A is planned to be installed and the classification of the servo system 30A. The transmission request and acquisition of the power failure operation auxiliary information can be performed, for example, in step S13 of FIG. 11.

FIG. 14 is a schematic view showing an example of the UI screen for inputting the setting conditions of the power failure operation for the selected servo system 30A in the present embodiment. On the UI screen shown in FIG. 14, as the power failure operation, an icon ("confirmation" button) for displaying the power failure operation auxiliary information is displayed together with a character string of "confirmation of power failure operation auxiliary information" on a screen which prompts the user to input whether or not the power failure operation unit is installed. On the UI screen shown in FIG. 14, a display operation is conducted which prompts the user to input the place where the selected servo system 30A is planned to be installed (delivered), and a display operation is conducted which prompts the user to input the classification (type) of the servo system 30A. When on the UI screen shown in FIG. 14, the user inputs the place where the selected servo system 30A is planned to be installed (delivered) and the classification of the servo system 30A, and operates the icon for displaying the power failure operation auxiliary information, the information request unit 21e of the selection device 20 transmits the transmission request for the power failure operation auxiliary information to the management device 10, and the power failure operation auxiliary information is transmitted from the management device 10 accordingly.

FIG. 15 is a schematic view showing an example of the UI screen on which the power failure operation auxiliary information is displayed. On the UI screen shown in FIG. 15, the hazard information indicating a failure that can occur at the time of power failure in "Tokyo Japan" which is the place where the servo system 30A is planned to be delivered and in a "gear machine" which is the classification (type) of the servo system 30A is displayed as the power failure operation auxiliary information. In the power failure operation auxiliary information shown in FIG. 15, the degree of risk when no measure is performed at the time of power failure, an event which can occur at the time of power failure and the details of the recommended power failure operation are displayed. The user references the power failure operation auxiliary information on the UI screen shown in FIG. 15, and thereby can input whether or not the addition of the power failure operation unit is needed and the details of the power failure operation.

As described above, in the servo amplifier selection system 1 of the present embodiment, when inputs of setting conditions of the power failure operation are received in the selection device 20, the information managed in the management device 10 is referenced, and the power failure operation auxiliary information indicating the possibility of occurrence of hazard information at the time of power failure in the place where the selected servo system 30 is installed and in the classification of the servo system 30 and the recommended measure for avoiding the hazard is displayed. Hence, the user references the power failure operation auxiliary information, and thereby can determine whether or not the addition of the power failure operation unit is needed and the details of the power failure operation. Hence, it is possible to realize the technology in which when the configuration of the servo system 30 is selected, a more appropriate power failure operation can be performed.

The present invention is not limited to the embodiments and variations described above, and various modifications, variations and the like are possible. For example, the method of calculating the parameters for determining the necessary configuration conditions at the time of power failure in the selection device 20 is not limited to the example described in the embodiment described above, and various calculation methods can be adopted.

A configuration may be adopted in which in the embodiments described above, part or the whole of the functions of the management device 10, the selection device 20 and the like is included in, for example, another device that can communicate through the network 40, and in which thus a plurality of devices as a whole realize the functions of the servo amplifier selection system 1.

The whole or part of the functions of the servo amplifier selection system 1 in the embodiments described above can be realized by hardware, software or a combination thereof. Here, the realization by software means that a processor reads and executes programs so as to achieve the realization. When part or the whole of the functions of the servo amplifier selection system 1 is formed by hardware, it can be formed with, for example, an integrated circuit (IC) such as an ASIC (Application Specific Integrated Circuit), a gate array, an FPGA (Field Programmable Gate Array) or a CPLD (Complex Programmable Logic Device).

When the whole or part of the functions of the servo amplifier selection system 1 is formed by software, in a computer which is formed with a storage unit such as a hard disk or a ROM that stores programs describing the whole or part of the operations of the servo amplifier selection system 1, a DRAM that stores data necessary for computations, a CPU and a bus that connects individual parts together, information necessary for computations is stored in the DRAM, and thus the programs are operated with the CPU, with the result that the whole or part thereof can be realized.

These programs are stored with various types of computer readable media, and can be supplied to a computer. The computer readable media include various types of tangible storage media. Examples of the computer readable media include magnetic recording media (such as a flexible disk, a magnetic tape and a hard disk drive), magneto-optical recording media (for example, a magneto-optical disk), a CD-ROM (Read Only Memory), a CD-R, a CD-R/W, a DVD-ROM (Digital Versatile Disk), a DVD-R, a DVD-R/W and semiconductor memories (for example, a mask ROM, a PROM (Programmable ROM), an EPROM (Erasable PROM), a flash memory and a RAM (Random Access Memory)). These programs may be downloaded to the computer of the user through a network so as to be distributed.

Although the embodiments of the present invention are described in detail above, the embodiments described above are simply specific examples for practicing the present invention. The technical range of the present invention is not limited to the embodiments described above. In the present invention, various modifications are possible without departing from the spirit thereof, and they are included in the technical range of the present invention.

EXPLANATION OF REFERENCE NUMERALS

1 servo amplifier selection system
10 management device
11, 21 CPU
11*a* information collection unit
11*b* history data management unit
11*c* request reception unit
11*d* information provision unit
12, 22 ROM
13, 23 RAM
14, 24 input unit
15, 25 display unit
16, 26 storage unit
16*a*, 26*a* specification data storage unit
16*b* history data storage unit
17, 27 communication unit
20 selection device
21*a* user interface (UI) display control unit
21*b* servo system selection unit
21*c* necessary condition calculation unit
21*d* power failure operation determination unit
21*e* information request unit
30 servo systems (installed in a plurality of production lines)
30A selected servo system
40 network
50 secure network

What is claimed is:

1. A servo amplifier selection device comprising:

a servo amplifier selection unit which references a storing unit for storing specification data of a plurality of servo amplifiers which are candidates to be selected so as to select a servo amplifier corresponding to a specification of a motor and a drive condition of the motor input by a user in a servo system from among the plurality of servo amplifiers;

a power failure operation condition setting unit which receives a setting of a condition on a power failure operation input by the user in the servo amplifier selected by the servo amplifier selection unit, the condition on the power failure operation comprising at least one of, to specify whether or not the rotation of a movable unit is stopped, to specify an axis whose rotation is stopped, to specify whether or not a movable coupling unit is separated, to specify an axis which is separated, and to input a distance when an axis is separated;

a power failure operation determination unit which determines, based on specification data of the servo amplifier selected by the servo amplifier selection unit and the condition on the power failure operation received by the power failure operation condition setting unit, a selection for the power failure operation in the selected servo amplifier; and a power failure operation output unit which outputs the selection for the power failure operation in the servo amplifier that is determined by the power failure operation determination unit.

2. The servo amplifier selection device according to claim 1, wherein the power failure operation determination unit determines the selection for the power failure operation in the selected servo system to be either a selection for the power failure operation which can be realized by control of software or a selection for the power failure operation which can be realized by installation of hardware.

3. The servo amplifier selection device according to claim 2, wherein the servo amplifier selection device comprises a necessary condition calculation unit that receives a selection of a power failure action selection part which has a function of selecting an operation at a time of power failure in the servo system selected by the servo amplifier selection unit, and calculates, based on a result of the selection received, a condition necessary for performing the power failure operation, and
the power failure operation determination unit determines, based on the condition necessary for the power failure operation which is calculated by the necessary condition calculation unit, the selection for the power failure operation in the selected servo amplifier.

4. The servo amplifier selection device according to claim 1, wherein the servo amplifier selection device comprises a necessary condition calculation unit that receives a selection of a power failure action selection part which has a function of selecting an operation at a time of power failure in the servo system selected by the servo amplifier selection unit, and calculates, based on a result of the selection received, a condition necessary for performing the power failure operation, and
the power failure operation determination unit determines, based on the condition necessary for the power failure operation which is calculated by the necessary condition calculation unit, the selection for the power failure operation in the selected servo amplifier.

5. The servo amplifier selection device according to claim 1, comprising: an information acquisition unit that acquires, from a power failure information database in which a place of use of the servo system and a situation of occurrence of the power failure are associated and stored, the situation of occurrence of the power failure corresponding to the place of use of the selected servo system,
wherein the power failure operation output unit outputs the situation of occurrence of the power failure which is acquired by the information acquisition unit.

6. The servo amplifier selection device according to claim 5, wherein in the power failure information database, the situation of occurrence of the power failure and restoration information on the servo system which is restored from the power failure by performing the power failure operation are associated and stored,
the information acquisition unit acquires the situation of occurrence of the power failure corresponding to the place of use of the selected servo system and the restoration information corresponding to the situation of occurrence of the power failure and
the power failure operation output unit outputs the situation of occurrence of the power failure and the restoration information which are acquired by the information acquisition unit.

7. The servo amplifier selection device according to claim 5, wherein the power failure information database is sequentially updated by information on operations from a plurality of the servo systems which are connected through a network.

8. The servo amplifier selection device according to claim 5, wherein the power failure operation condition setting unit receives an input of a classification of the servo system, and
the power failure operation output unit outputs, based on the classification of the servo system which is input and the situation of occurrence of the power failure which is acquired by the information acquisition unit, information on a risk at the time of power failure and information on necessity of the power failure operation corresponding to the risk.

9. The servo amplifier selection device according to claim 8, wherein the information acquisition unit acquires, from a hazard information database in which hazard information indicating a failure that can occur at the time of power failure in the servo system is associated with the classification of the servo system and is stored, the hazard information corresponding to the selected servo system, and
the power failure operation output unit outputs, based on the hazard information acquired by the information acquisition unit, the information on the risk at the time of power failure.

10. The servo amplifier selection device according to claim 9, wherein the hazard information database is sequentially updated based on the information on the operations from the servo systems which are connected through a network.

11. The servo amplifier selection device according to claim 9, wherein in the hazard information database, the power failure operation for the hazard information identified from the restoration information on the servo system which is restored from the power failure by performing the power failure operation is stored, and
the information acquisition unit acquires the power failure operation for the hazard information together with the hazard information.

12. A servo amplifier selection method comprising:
a servo amplifier selection step of referencing a storing unit for storing specification data of a plurality of servo amplifiers which are candidates to be selected so as to select a servo amplifier corresponding to a specification of a motor and a drive condition of the motor input by a user in a servo system from among the plurality of servo amplifiers;
a power failure operation condition setting step of receiving a setting of a condition on a power failure operation input by the user in the servo amplifier selected in the servo amplifier selection step, the condition on the power failure operation comprising at least one of: to specify whether or not the rotation of a movable unit is stopped, to specify an axis whose rotation is stopped, to specify whether or not a movable coupling unit is separated, to specify an axis which is separated, and to input a distance when an axis is separated;
a power failure operation determination step of determining, based on specification data of the servo amplifier selected in the servo amplifier selection step and the condition on the power failure operation received in the power failure operation condition setting step, a method for the power failure operation in the selected servo amplifier; and
a power failure operation output step of outputting the method for the power failure operation in the servo amplifier that is determined in the power failure operation determination step.

13. A non-transitory computer readable recording medium recording a program for making a computer to realize comprising:
- a servo amplifier selection function of referencing a storing unit for storing specification data of a plurality of servo amplifiers which are candidates to be selected so as to select a servo amplifier corresponding to a specification of a motor and a drive condition of the motor input by a user in a servo system from among the plurality of servo amplifiers;
- a power failure operation condition setting function of receiving a setting of a condition on a power failure operation input by the user in the servo amplifier selected by the servo amplifier selection function, the condition on the power failure operation comprising at least one of: to specify whether or not the rotation of a movable unit is stopped, to specify an axis whose rotation is stopped, to specify whether or not a movable coupling unit is separated, to specify an axis which is separated, and to input a distance when an axis is separated;
- a power failure operation determination function of determining, based on specification data of the servo amplifier selected by the servo amplifier selection function and the condition on the power failure operation received by the power failure operation condition setting function, a method for the power failure operation in the selected servo amplifier; and
- a power failure operation output function of outputting the method for the power failure operation in the servo amplifier that is determined by the power failure operation determination function.

* * * * *